United States Patent
Zadeh et al.

(10) Patent No.: US 6,870,495 B1
(45) Date of Patent: Mar. 22, 2005

(54) DOUBLE THROUGHPUT ANALOG TO DIGITAL CONVERTER

(75) Inventors: Ali E. Zadeh, Los Angeles, CA (US); Lin P. Ang, Los Angeles, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/779,748

(22) Filed: Feb. 18, 2004

(51) Int. Cl.[7] .............................................. H03M 1/38
(52) U.S. Cl. ..................................... 341/161; 341/136
(58) Field of Search ................................ 341/161, 143, 341/172, 155, 146, 141, 144

(56) References Cited

U.S. PATENT DOCUMENTS

| | | | | |
|---|---|---|---|---|
| 5,477,481 A | * | 12/1995 | Kerth | 708/819 |
| 6,078,276 A | * | 6/2000 | Signell et al. | 341/146 |
| 6,313,779 B1 | * | 11/2001 | Leung et al. | 341/155 |
| 6,400,220 B1 | * | 6/2002 | Wang et al. | 330/9 |
| 6,707,405 B2 | * | 3/2004 | Kuttner | 341/141 |
| 6,753,801 B2 | * | 6/2004 | Rossi | 341/161 |
| 2004/0036453 A1 | * | 2/2004 | Rossi | 323/242 |

OTHER PUBLICATIONS

"Understanding Pipelined ADCs", Maxim Integrated Products, www.maxim–ic.com/appnotes.cfm/appnote_number/383, 2003.

Brian Black, "Analog–to–Digital Converter Architectures and Choices for System Design", Analog Dialogue 33–8 (1999).

* cited by examiner

*Primary Examiner*—Jean Jeanglaude
*Assistant Examiner*—Joseph Lauture
(74) *Attorney, Agent, or Firm*—Dickstein Shapiro Morin & Oshinsky LLP

(57) ABSTRACT

A pipelined analog-to-digital converter features an amplifier block that includes a switching network to implement a double sampling and double conversion principle of operation. The amplifier block utilizes both phases of a clock for sampling and conversion. Additionally, each stage of the analog-to-digital converter is associated with two independent processing blocks. The analog-to-digital converter can achieve double throughput for approximately the same level of power consumption. Alternatively, throughput may be maintained, but the gain-bandwidth of the amplifier block may be reduced by half, thereby halving the DC bias current consumed by the amplifier. Additionally, the output signal of the amplifier itself is not reset to a common mode voltage.

32 Claims, 8 Drawing Sheets

DOUBLE THROUGHPUT ANALOG TO DIGITAL CONVERTER

FIELD OF INVENTION

The present invention relates generally to analog to digital conversion, and more particularly, to a double throughput analog to digital converter.

BACKGROUND OF THE INVENTION

Analog integrated circuits (ICs) are integrated circuits that process analog signals. Examples of such circuits include, for example, amplifiers, reference current sources, and reference voltage sources. Analog ICs often require the use of, and constantly consume, a DC bias current. Digital integrated circuits are ICs which process digital signals. Examples of digital integrated circuits include, for example, logical circuit and state machines, such as processors. Digital circuits with complementary metal oxide semiconductor (CMOS) logic generally do not use a DC bias current.

Some integrated circuits, however, process both analog and digital signals. Such circuits are known as mixed signal integrated circuits. Mixed signal ICs generally require the use of a DC bias current supply. A common example of a mixed signal circuit is an analog-to-digital converter (ADC). ADCs accept an input analog signal and produce an output digital signal having a value corresponding to the magnitude of the input analog signal. ADCs are found in numerous products, including a variety of portable electronic devices, such as CMOS based imaging products. Many CMOS based imaging products include ICs that include a plurality of ADCs, so that a plurality of analog signals can be simultaneously converted to corresponding digital signals. Since portable electronic devices are generally battery powered, it is desirable to reduce the power consumption of mixed signal ICs, such as those ICs which include ADCs.

FIG. 1 illustrates general features of a conventional pipelined ADC 100. ADC 100 comprises a clock generator 110, a reference voltage source 120, a plurality of cascaded identical stages 101, and a digital block 130. The digital block 130 provides N output bits, one for each of stages 101.

Now also referring to FIG. 3, it can be seen that the clock generator 110 accepts a clock signal $\phi$ and produces two non-overlapping clock signals $\phi 1$ and $\phi 2$. The two clock signals $\phi 1$ and $\phi 2$ are generated so that they define distinct phases for each clock cycle of the original clock signal $\phi$. In each stage 101 of a typical ADC 100, different tasks are performed during the different phases defined by clock signals $\phi 1$ and $\phi 2$. For example, in each odd stage 101 (e.g., a first, third, fifth, etc. stage of the ADC 100), when clock signal $\phi 1$ is high, the stage 101 is in a sampling phase, and when clock signal $\phi 2$ is high, the stage 101 is in a conversion phase. Each adjacent phase utilizes the clock signals $\phi 1$ and $\phi 2$ in a complementary fashion. Thus, in the above example, each even stage 101 (e.g., a second, fourth, sixth, etc. stage 101 of the ADC 100) is in a conversion phase when clock signal $\phi 1$ is high and each even stage is in a sampling phase when clock signal $\phi 2$ is high. The reference voltage generator 120 accepts a power signal from the power supply (not illustrated) and outputs a reference voltage signal Vref. The two clock signals $\phi 1$, $\phi 2$ and the reference voltage signal are supplied to each stage 101.

Each stage 101 accepts an input signal and outputs an output signal. The stages 101 are cascaded, so that the first stage 101 accepts an input signal at terminal 150 and outputs a signal which becomes the input signal for the next stage; and so forth. More specifically, when clock signals $\phi 1$ or $\phi 2$ corresponds to a sampling phase of a given stage 101 of the ADC 100, the input signal of each stage 101 is distributed to processing block 103 and a first input terminal for amplifier block 102.

Processing block 103 implements the well known process of performing an analog-to-digital conversion of the input signal and generating an analog signal corresponding to the (partially) converted digital signal. The generated analog signal, when presented as an input signal to amplifier 215 of the amplifier block 102, generates a residual analog signal in the amplifier 215 which, after amplification, would be suitable for use in the next stage of the pipeline. More specifically, in processing block 103, the input signal is converted into a 2-bit digital signal B0, B1. The 2-bit digital signal B0, B1 is output to the digital block 130. Additionally, the 2-bit digital signal B0, B1 is used to control a digital-to-analog converter (in processing block 103), which supplies an analog signal corresponding to the converted value to a second input terminal of the amplifier block 102. Since the amplifier block 102 accepts a differential input signal in which the magnitude of the input signal is the voltage difference between the two inputs, the amplifier block receives at its inputs what is known in the art as the residual signal (i.e., the original signal minus the converted value).

FIGS. 2A and 2B are block diagrams of the amplifier block 102, which illustrate the amplifier block 102 as comprising a switched capacitor amplifier 210 (FIG. 2A) and a common mode feedback circuit 250 (FIG. 2B). The switched capacitor amplifier 210 is a network comprising a pair of input terminals 211a, 211b, respectively for a differential input signal comprising signals Vinp (coupled to the Vin signal) and Vinn (coupled to the output signal from processing block 103); a pair of input terminals 211c, 211d respectively for a differential reference signal comprising signals Vrefp, Vrefn; input terminal 211e for a common mode voltage reference signal Vcm (in the middle of the power supply range); switches 212a and 212b respectively controlled by clock signals $\phi 1$ and $\phi 2$; capacitors 213a, 213b, 214a, 214b; nodes A, B, and C; amplifier 215; and output terminals 216a and 216b, respectively for a differential output signal comprising signals Voutn and Voutp, arranged as shown. Switches 212a are closed when clock signal $\phi 1$ is high and open when clock signal $\phi 1$ is low. Similarly, switches 212b are closed when clock signal $\phi 2$ is high and open when clock signal $\phi 2$ is low. The relationship between clock signals $\phi 1$ (high during a sampling phase of the ADC) and $\phi 2$ (high during a conversion phase of the ADC) is shown in FIG. 3. Typically, capacitors 213a and 213b are identical, and 214a and 214b are also identical.

The common mode feedback circuit 250 includes input terminal 251 for receiving the common mode voltage Vcm; input terminal 216 for receiving a bias voltage Vbias; switches 252a and 252b which are respectively controlled by clock signals $\phi 1$ and $\phi 2$; capacitors 253–256; and nodes A, B, and C, respectively coupled to corresponding nodes of the switched capacitor amplifier 210. Switches 252a are closed when clock signal $\phi 1$ is high and open when clock signal $\phi 1$ is low. Similarly, switches 252b are closed when clock signal $\phi 2$ is high and open when clock signal $\phi 2$ is low.

The processing performed in the processing block 103 is primarily digital processing and little power is wasted there. However, the processing performed in the amplifier block is analog processing, and as described below, wasteful in power consumption.

While clock $\phi 1$ is high, in addition to the above-described processing performed by the processing section 103, the differential input signals at the amplifier block 102, i.e., signals Vinp and Vinn, are respectively sampled by input capacitors 213a, 213b. Additionally, a common mode voltage Vcm is supplied to the opposite side of each capacitor. The common mode voltage Vcm is typically set to the average value between the voltage levels of the two power supply rails. That is, if one power supply rail is ground and another is 5 volts, Vcm would be 2.5 volts. During this phase, the amplifier 215 is idle, and the outputs Voutn, Voutp of the amplifier 215 are shorted to each other. Outputs Voutn, Voutp are each maintained at a voltage level equal to the common mode voltage Vcm via the common mode feedback circuit 250. Once adequate time has elapsed to permit capacitors 213a, 213b, 214a, 214b to sample the input signals Vinp, Vinn, the clock signal φ1 goes low and the sampling phase ends.

At the same time, clock signal φ2 goes high, to indicate the start of the conversion phase. During this phase, no processing is performed by the processing section 103. However, in amplifier block 102, capacitors 213a, 213b are coupled as inputs to the amplifier 215 and capacitors 214a, 214b, are connected to provide negative feedback across amplifier 215. The amplifier 215 produces an output signal comprising signals Voutn, Voutp in accordance with equation (1) below:

$$(Voutp-Voutn)/(Vinp-Vinn)=(1+(Cin/Cfb)) \qquad (1),$$

where Cin is the capacitance of a input capacitor, such as capacitor 213a, and Cfb is the capacitance of a feedback capacitor, such as capacitor 214a. Since each stage of the ADC 100 is responsible for ultimately converting 1-bit of the entire analog-to-digital processing, a gain of 2.0 is desired (since each bit differs in magnitude from the next bit by a factor of 2). Typically, this is achieved by setting Cin equal to Cfb.

One problem associated with the above described operation is that each stage 101 of the analog to digital converter 100 is operated in a manner which wastes power. More specifically, in each stage 101, the amplifier 215 is idle during the sampling phase but still consumes bias current. Additionally, during the sampling phase, the outputs of the amplifier 215 are shorted together. As a result, during the conversion phase, the outputs of the amplifier must slew from the common mode voltage (Vcm) to the appropriate voltage. This slewing between the common mode and required voltage further increases power consumption and affects accuracy of settling time.

Accordingly, it would be advantageous to increase power efficiency and improve operation an analog to digital converter.

SUMMARY OF THE INVENTION

The present invention is directed to improving the efficiency and throughput of an analog to digital converter. More specifically, the amplifier block for each stage of an analog to digital converter is provided with a switching network for implementing a double sampling and double conversion analog to digital converter stage. Rather than using one phase of a clock cycle for sampling and another for conversion, the both phases of the clock are used for sampling and conversion. By also using two independent processing blocks per stage, the analog to digital converter of the invention can achieve double throughput for approximately the same level of power consumption as with a conventional analog to digital converter. Alternatively, throughput may be maintained at the same level as that of a conventional analog to digital converter. This permits reducing the gain bandwidth of the amplifier blocks in the invention by about half, thereby affecting a power reduction in comparison with the conventional analog to digital converter. Additionally, the output signal of the amplifier itself is not reset to a common mode voltage.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 4:
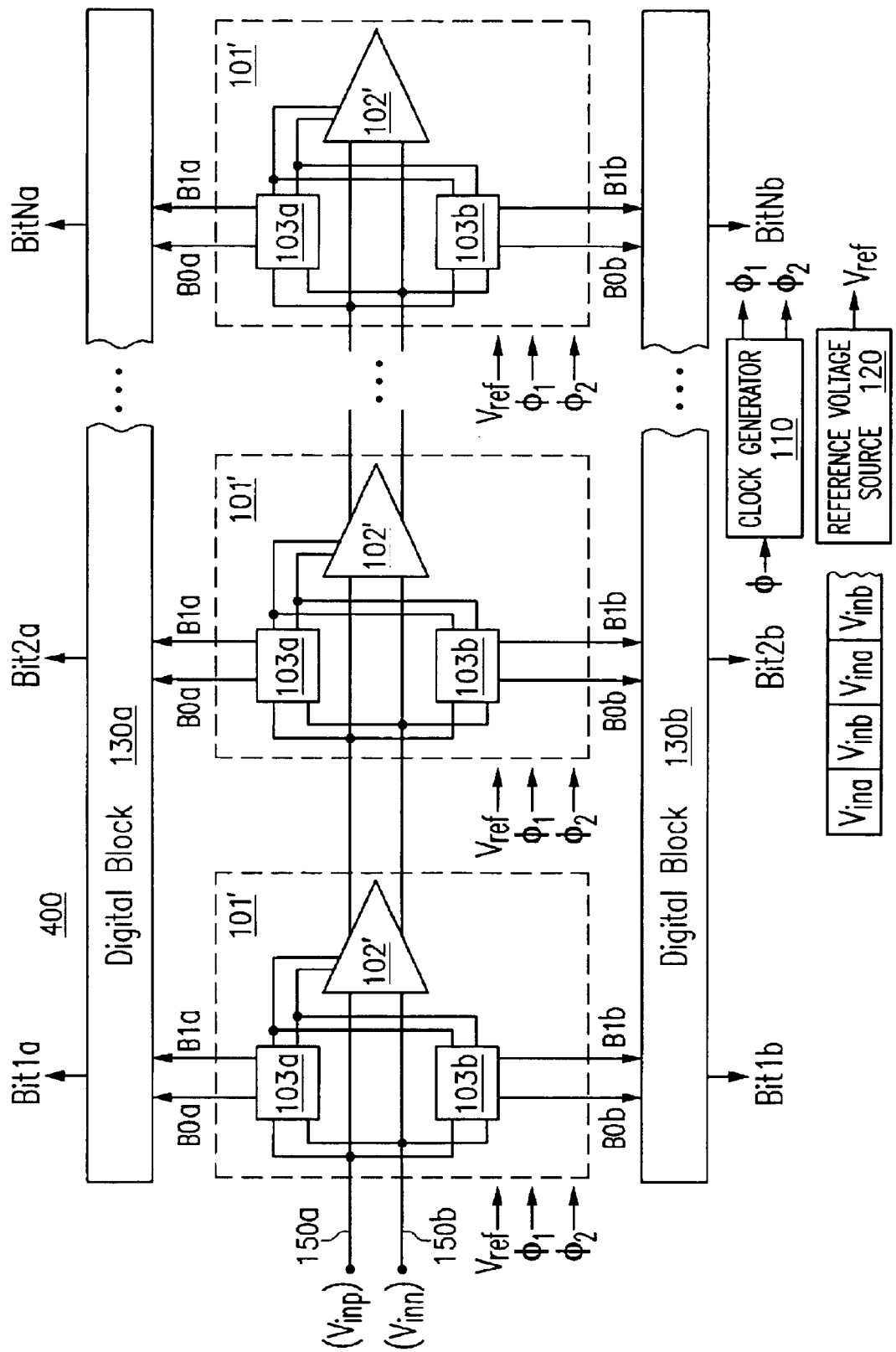
FIG. 4 is a block diagram of a pipelined analog-to-digital converter in accordance with an exemplary embodiment of the invention.

The ADC 400 of the exemplary embodiment shown in FIG. 4 include amplifier blocks 102' that operate continuously. This is achieved by providing the ADC 400 with two input analog signal streams (Vina, Vinb) to convert into two corresponding digital output signals. As shown in FIG. 4, the two analog input signal streams (Vina, Vinb) are combined in a time multiplexed fashion to form a single input signal, which is presented as a differential signal having components Vinp, Vinn to the input signal pins 150a, 150b. Similarly, the two digital output signals Bit1a, Bit2a, . . . BitNa and Bit1b, Bit2b, . . . , BitNb are output from two digital blocks 130a, 130b as described below.

Figure 1:
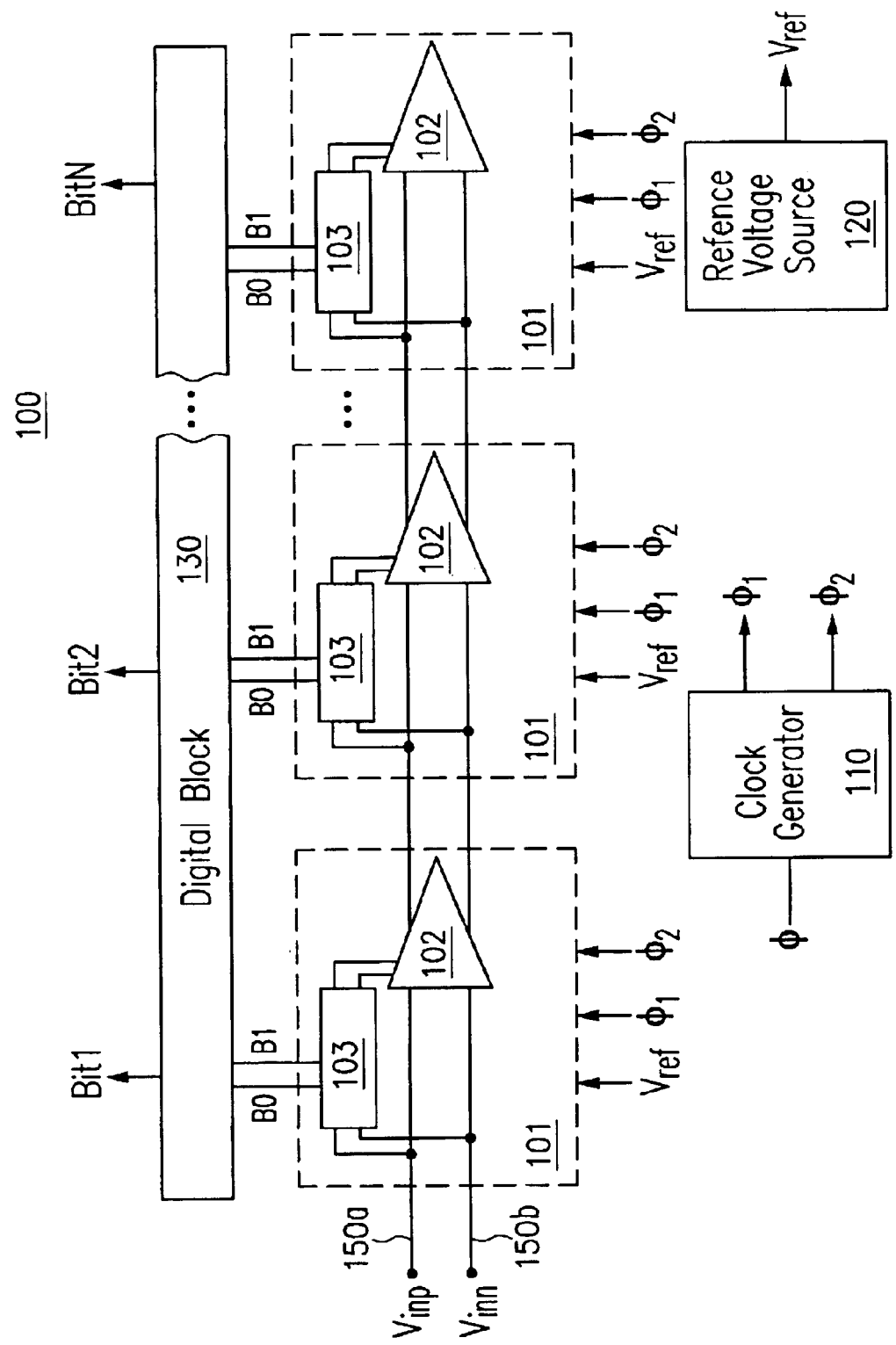
FIG. 1 is a block diagram of a conventional pipelined analog-to-digital converter.

Now referring to the drawings, where like reference numerals designate like elements, FIG. 4 shows a block diagram of the pipelined ADC 400. ADC 400 can include the same clock generator 110 and reference voltage generator 120 as ADC 100 (FIG. 1). Thus, the reference voltage (Vref) and clock signals (φ1, φ2) can operate as in ADC 100.

During each phase of operation, each stage 101' accepts an input signal and outputs an output signal. The stages 101' are cascaded, so that the first stage 101' accepts an input signal at terminal 150 and outputs a signal which becomes the input signal for the next stage 101'. Each stage 101' can be similar to stage 101 of ADC 100. However, in each stage 101' there are two processing blocks 103a, 103b, and as described below in connection with FIGS. 5A and 5B, the circuitry of amplifier block 102' is different from that of amplifier block 102 of ADC 100.

Each processing block 103a and 103b can have the same circuitry, and perform the same function, as processing block 103 of ADC 100. However, processing block 103a performs its function with respect to the first input signal stream Vina while processing block 103b performs its function with respect to the second input signal stream Vinb. Since the two input signal streams Vina, Vinb are time multiplexed (e.g., a signal from stream Vina is presented at inputs 150a, 150b when clock φ41 is high, while a signal from Vinb is presented at inputs 150a, 150b when clock φ2 is high), processing block 103a is clocked to perform its sampling phase when clock signal φ1 is high, while processing block 103b is clocked to perform its sampling phase when clock signal φ2 is high. Similarly, associated with the processing blocks 103a is a digital block 130a, and associated with processing blocks 103b is a digital block 130b. Digital blocks 130a and 130b have the same circuitry, and perform the same function, as processing block 130 of ADC 100. Thus, digital block 130a output signals Bit1a, Bit2a, . . . , BitNa from signals B0a, B1a from the plurality of processing blocks 103a while digital block 130b output signals Bit1b, Bit2b, . . . , BitNb from signals B0b, B1b from the plurality of processing blocks 103b.

Figure 2A:
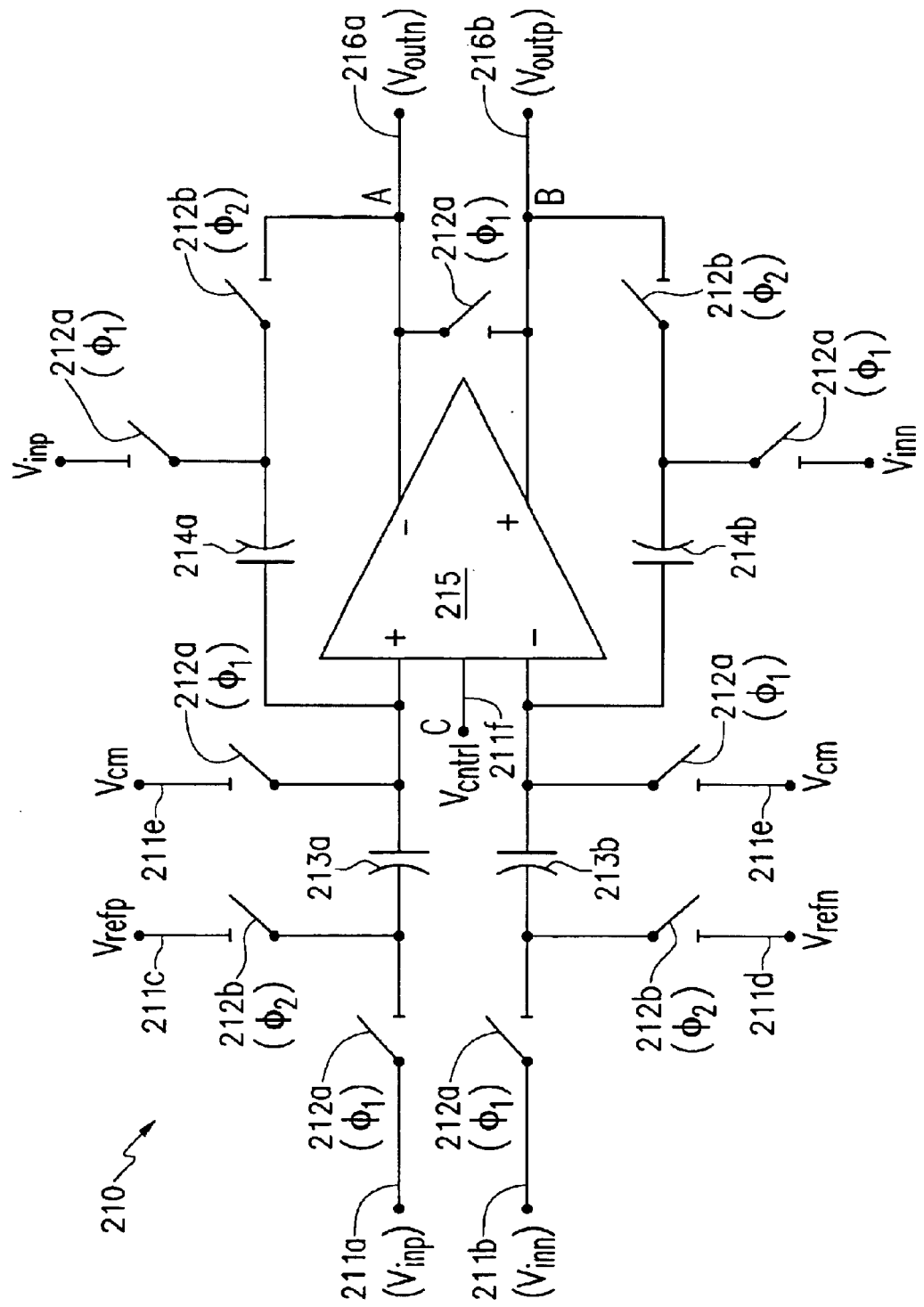
FIGS. 2A and 2B are schematic circuit diagrams of one of the amplifier blocks of FIG. 1, including the switched capacitor amplifier (FIG. 2A) and the common mode feedback circuit (FIG. 2B)
Figure 2B:
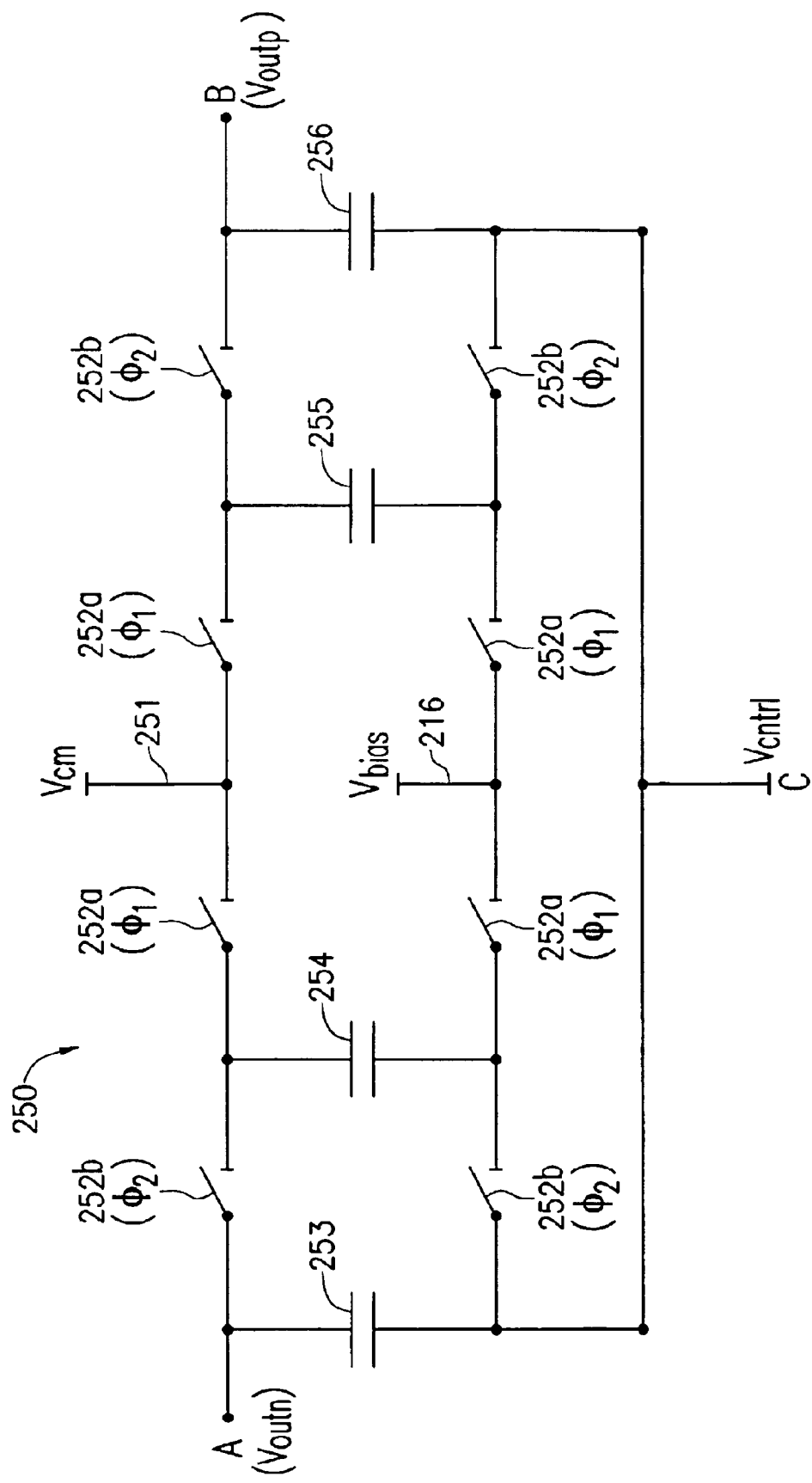
Figure 3:
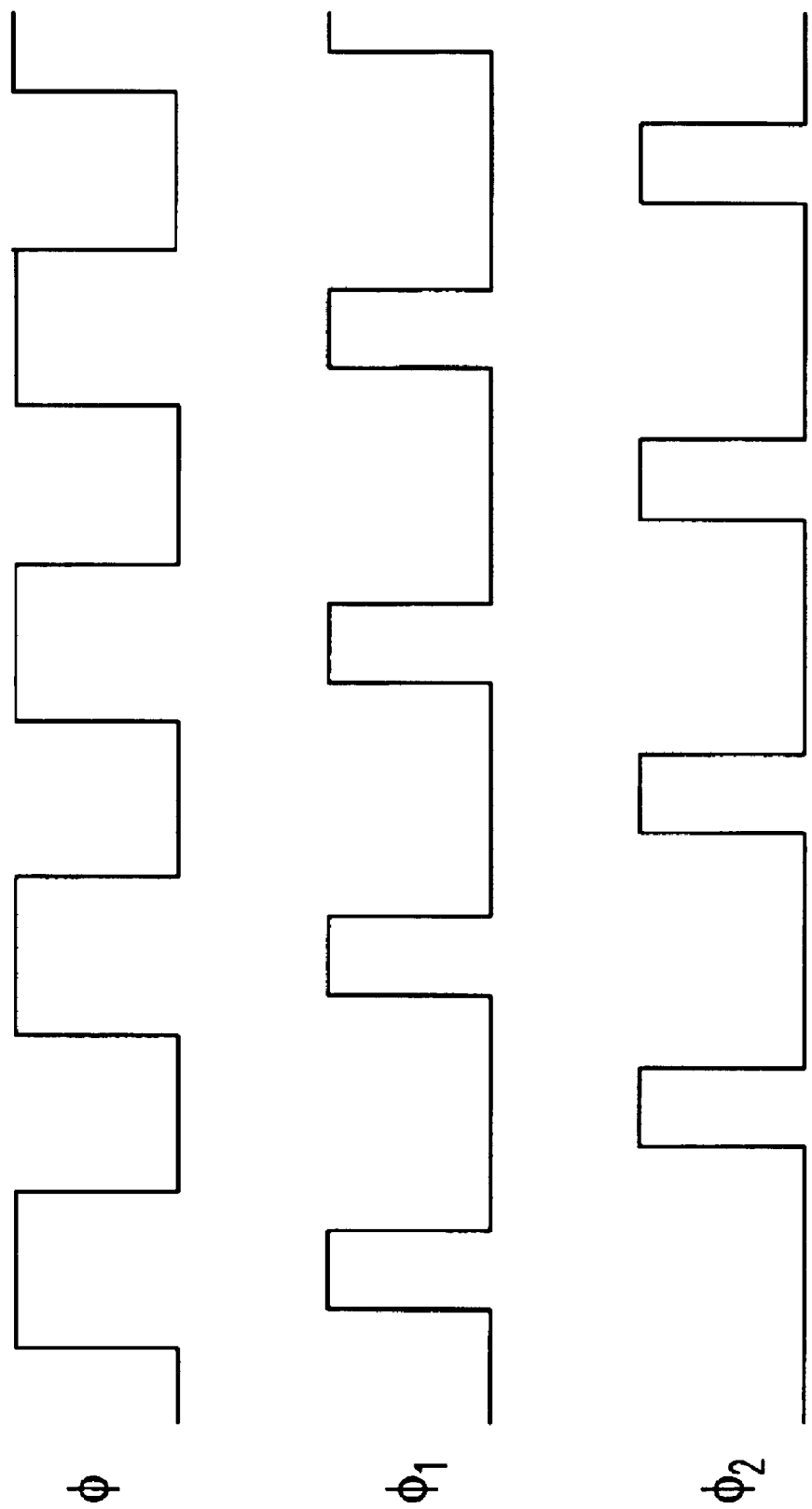
FIG. 3 is a timing diagram illustrating the relationship between clock signals in FIGS. 1, 2A, and 2B.
Figure 5A:
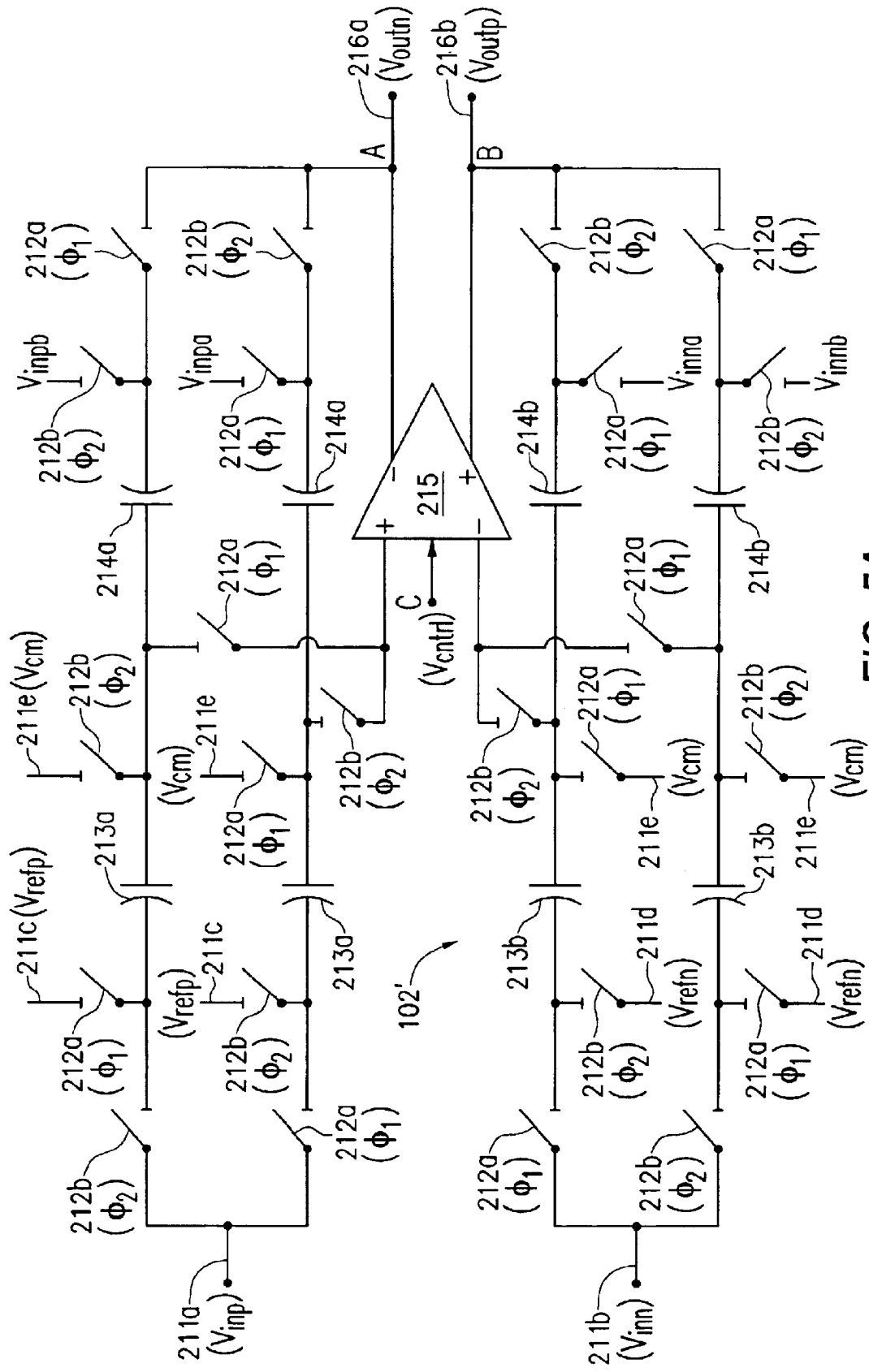
FIGS. 5A and 5B are schematic circuit diagrams of a switched capacitor amplifier and its associated common mode feedback circuit, respectively, in one of the amplifier blocks of FIG. 4.
Figure 5B:
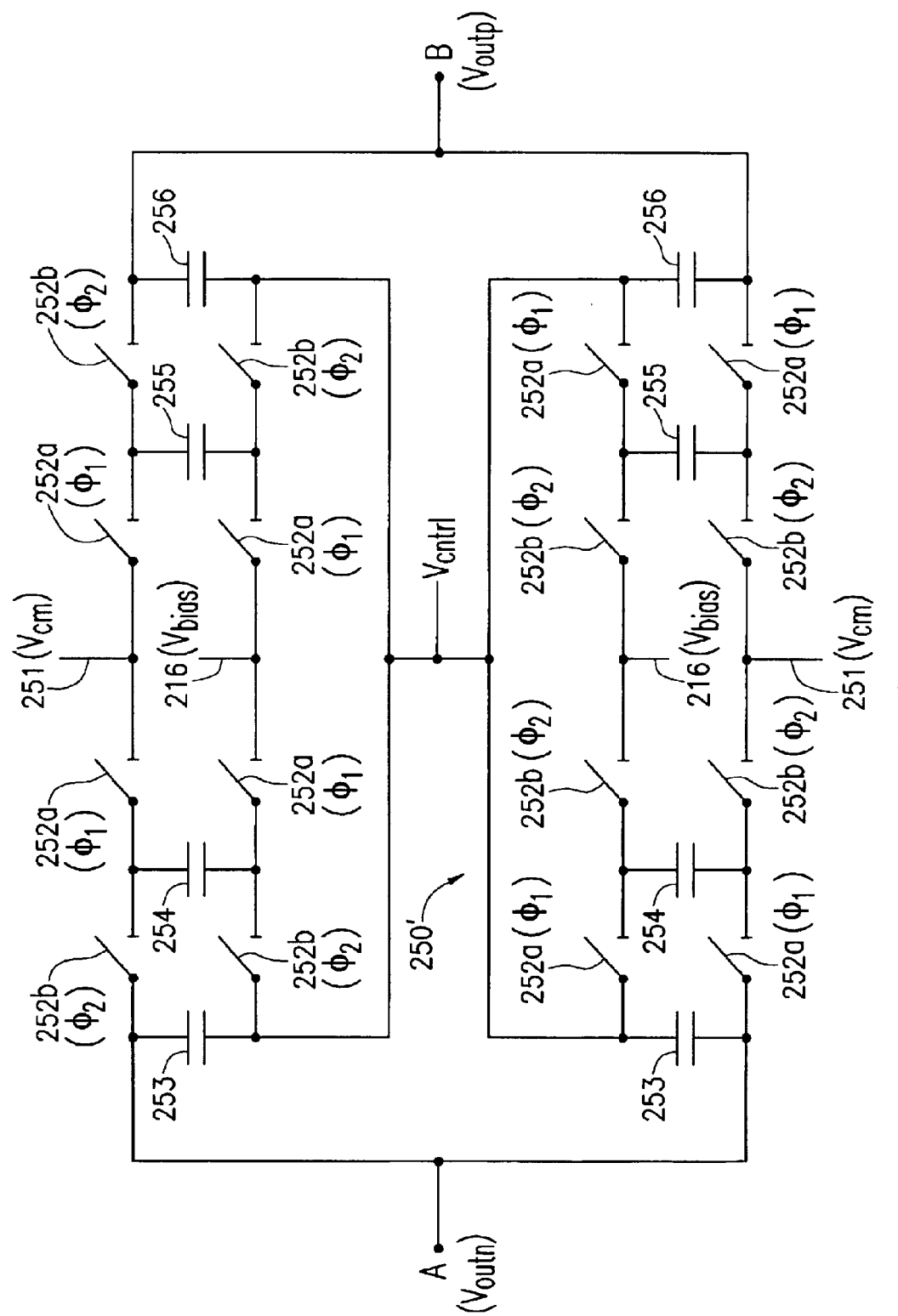

FIGS. 5A and 5B are block diagrams of the amplifier block 102', which illustrate the amplifier block 102' as comprising a switched capacitor amplifier 210' (FIG. 2A) and a common mode feedback circuit 250' (FIG. 2B). The switched capacitor amplifier 210' is a network comprising a pair of input terminals 211a, 211b, respectively for a time-multiplexed differential input signal comprising signals Vinp, Vinn; two pairs of input terminals 211c, 211d respectively for a differential reference signal comprising signals Vrefp, Vrefn; input terminals 211e for a common mode voltage reference signal Vcm; switches 211a and 211b respectively controlled by clock signals φ1 and φ2; capacitors 213a, 213b, 214a, 214b; nodes A, B, and C; amplifier 215; and output terminals 216a and 216b, respectively for a time multiplexed differential output signal comprising signals Voutn and Voutp, arranged as shown. The signals on output terminals 216a and 216b are provided as input to the next stage 101'. The fully differential circuitry of FIG. 5A rejects common mode noise. Switches 212a are closed when clock signal φ1 is high and open when dock signal φ1 is low. Similarly, switches 212b are closed when clock signal φ2 is high and open when clock signal φ2 is low.

The common mode feedback circuit 250', which corrects imbalance in common mode voltage, includes input terminals 251 for receiving the common mode voltage Vcm; input terminals 216 for receiving a bias voltage Vbias; switches 252a and 252b which are respectively controlled by clock signals φ1 and φ2; capacitors 253–256; and nodes A, B, and C, respectively coupled to corresponding nodes of the switched capacitor amplifier 210'. Switches 252a are closed when clock signal φ1 is high and open when clock signal φ1 is low. Similarly, switches 252b are closed when clock signal φ2 is high and open when clock signal φ2 is low. In one exemplary embodiment, capacitors 254–255 were each 0.03 pico-farad capacitors while capacitor 253, 256 were each 0.1 pico-farad capacitors.

The processing performed in the amplifier block 102' in the switched capacitor amplifier 210' and common mode feedback circuit 250' can be understood from the above description of operations of amplifier block 102 (FIG. 1). However, the use of two separate input/output networks permits the two networks to be respectively controlled by clock signals φ1 and φ2. More specifically, when φ1 is high and φ2 is low, one network is formed by closing switches 212a and 252a and opening switches 212b and 252b. While φ1 is low and φ2 is high, the other network is formed by closing switches 212b and 252b and opening switches 212a and 252a.

Thus, while each network still alternates between the sampling phase and the conversion phase, the two networks are out of phase by the difference between the two clock signals φ1 and φ2, and thus, the shared amplifier 215 is never idle. In contrast to a single sampling and single conversion technique, where the shared amplifier 215 spends approximately half its time idling while consuming power by using DC bias current, in the exemplary embodiment the current draw remains the same. Thus, if the clocks φ1 and φ2 were maintained at the same rate as a clock signal for a single sampling and single conversion, the amplifier of FIGS. 4, 5A, and 5B would have double throughput while drawing approximately the same amount of power. Alternatively, the clocks φ1 and φ2 can be reduced in frequency by 50% relative to a single sample single conversion amplifier, and thus maintain the same throughput. However, in this scenario the required gain-bandwidth of the amplifier is also cut by half, thereby reducing power consumption by half as well. Thus, the amplifier of FIGS. 4, 5A, and 5B may be used in at least two manners to reduce power consumption by approximately half.

Figure 6:
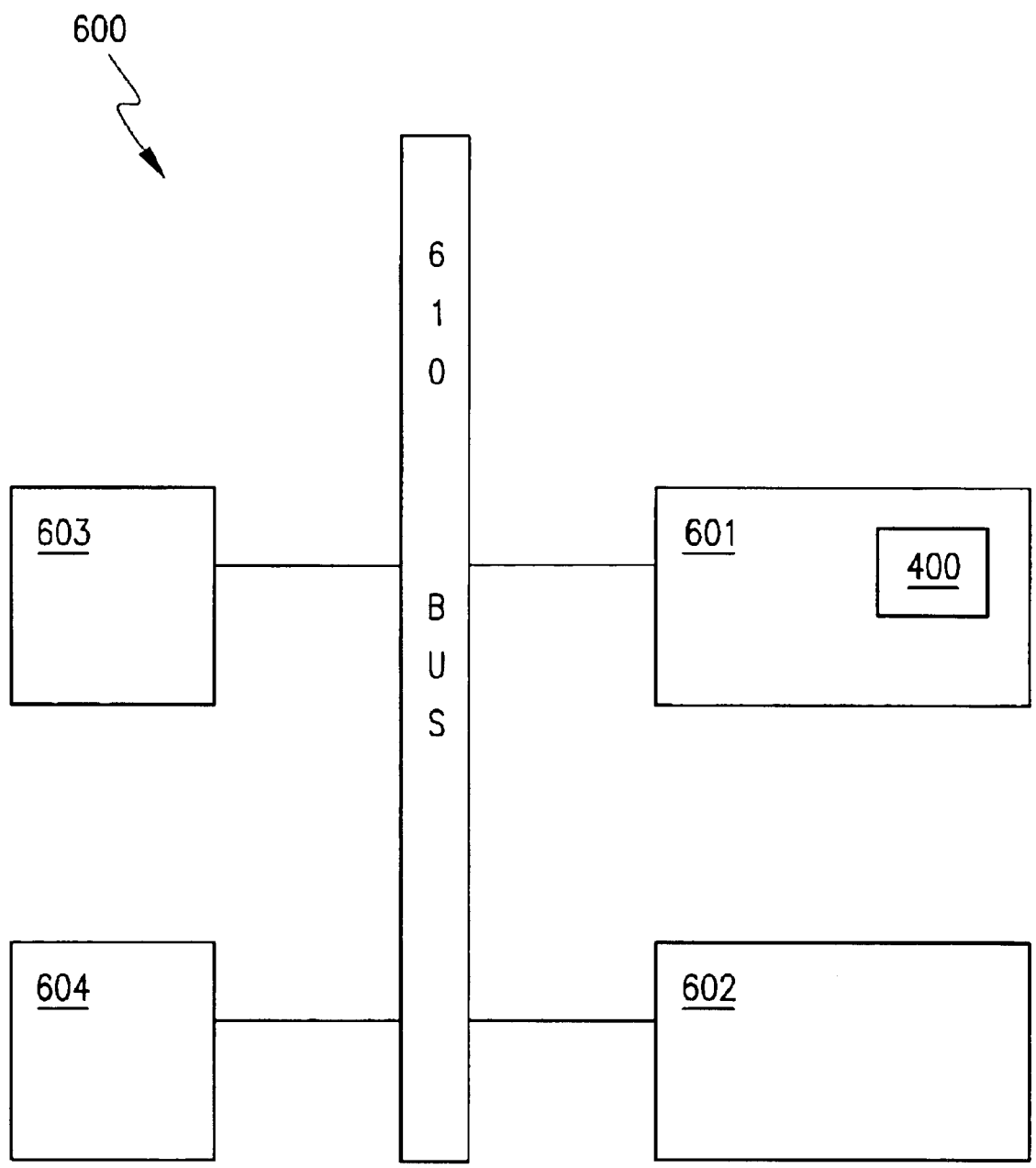
FIG. 6 is a block diagram of a processor based system having an integrated circuit with the ADC of FIG. 4.

FIG. 6 illustrates a processor based system 600 having an integrated circuit 601 including the ADC 400 of FIG. 4. In particular, the integrated circuit 601 may include a CMOS imager (not illustrated), and the imager may include two ADCs to increase throughput. The system 600 further includes a memory device 602, a processor 603, and a peripheral 604. Each of these components are coupled to a bus 610. The processor based system may include additional devices, and may be a portable consumer electronics device, such as a digital camera, cellular telephone, pacemaker, defibrillator, toy, or other battery-operated device.

While the invention has been described in detail in connection with exemplary embodiments, it should be understood that the invention is not limited to the above disclosed embodiments. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A circuit, comprising:
    first and a second input connections;
    an amplifier having a first amplifier input, a second amplifier input, a first amplifier output, and a second amplifier output;
    a first network that is switchable to receive at least a first differential input signal from said first and second input connections and a first differential feedback signal from said first and second amplifier outputs, and that provides said at least a first differential signal to the first and second inputs of said amplifier; and
    a second switchable network that receives at least a second differential input signal from said first and second input connections and a second differential feedback signal from said first and second amplifier outputs, and that provides said at least second differential signal to the first and second input of said amplifier;
    wherein said first and second network are switched so that at any given time only one of said first and second switchable networks is coupled to said first and second input connections, said first and second amplifier inputs, and said first and second amplifier outputs.

2. The circuit of claim 1, wherein said first and second networks each comprise an input capacitor and a feedback capacitor.

3. The circuit of claim 1, wherein
said first network is switched to be coupled to said first and second input connections, said first and second amplifier outputs, and said first and second inputs of said amplifier when a first clock signal is high;
said first network is switched to be decoupled from said first and second input connections, said first and second amplifier outputs, and said first and second inputs of said amplifier when the first clock signal is low;
said second network is switched to be coupled to said first and second input connections, said first and second amplifier outputs, and said first and second inputs of said amplifier when a second clock signal is high; and
said second network is switched to be decoupled from said first and second input connections, said first and second amplifier outputs, and said first and second inputs of said amplifier when the second clock signal is low.

4. The circuit of claim 3, wherein said first and second clock signals share a same period and are out of phase by half a period.

5. The circuit of claim 4, further comprising,
a clock generator;
wherein said clock generator accepts a master clock signal and produces the first clock signal and the second clock signal as alternating, non-overlapping signals.

6. The circuit of claim 3, wherein said first clock signal and said second clock signal each have a period equal that of said master clock signal.

7. The circuit of claim 6, wherein said first and second clock signals are out of phase by half a period.

8. A processor based system, comprising:
a processor; and
a circuit, coupled to said processor, said circuit further comprising;
a first and a second input connections;
an amplifier having a first amplifier input, a second amplifier input, a first amplifier output, and a second amplifier output;
a first network that is switchable to receive at least a first differential input signal from said first and second input connections and a first differential feedback signal from said first and second amplifier outputs, and that provides said at least a first differential signal to the first and second inputs of said amplifier; and
a second switchable network that receives at least a second differential input signal from said first and second input connections and a second differential feedback signal from said first and second amplifier outputs, and that provides said at least second differential signal to the first and second input of said amplifier;
wherein said first and second network are switched so that at any given time only one of said first and second switchable networks is coupled to said first and second input connections, said first and second amplifier inputs, and said first and second amplifier outputs.

9. The circuit of claim 8, wherein said first and second networks each comprise an input capacitor and a feedback capacitor.

10. The circuit of claim 8, wherein
said first network is switched to be coupled to said first and second input connections, said first and second amplifier outputs, and said first and second inputs of said amplifier when a first clock signal is high;
said first network is switched to be decoupled from said first and second input connections, said first and second amplifier outputs, and said first and second inputs of said amplifier when the first clock signal is low;
said second network is switched to be coupled to said first and second input connections, said first and second amplifier outputs, and said first and second inputs of said amplifier when a second clock signal is high; and
said second network is switched to be decoupled from said first and second input connections, said first and second amplifier outputs, and said first and second inputs of said amplifier when the second clock signal is low.

11. The circuit of claim 10, wherein said first and second clock signals share a same period and are out of phase by half a period.

12. The circuit of claim 11, further comprising,
a clock generator;
wherein said clock generator accepts a master clock signal and produces the first clock signal and the second clock signal as alternating, non-overlapping signals.

13. The circuit of claim 10, wherein said first clock signal and said second clock signal each have a period equal that of said master clock signal.

14. The circuit of claim 13, wherein said first and second clock signals are out of phase by half a period.

15. A pipelined analog to digital converter, comprising:
a plurality of stages, each stage further comprising, an input terminal;
an output terminal;
an amplifier, coupled to said output terminal;
a first processing section for performing a partial analog to digital conversion of a first signal and for providing a first residual signal to said amplifier; and
a second processing section for performing a partial analog to digital conversion of a second signal and for providing a second residual signal to said amplifier;
a first digital block, for receiving results of a partial analog to digital conversion from the first processing section of each stage, and for providing a full analog to digital conversion of a first input signal; and
a second digital block, for receiving results of a partial analog to digital conversion from the second processing section of each stage, and for providing a full analog to digital conversion of a second input signal;
wherein said plurality of stages are arranged in a cascade so that the output terminal of one stage is coupled to the input terminal of a subsequent stage.

16. The pipelined analog to digital converter of claim 15, further comprising:
a clock generator;
wherein said clock generator accepts a master clock signal and produces the first clock signal and the second clock signal as alternating, non-overlapping signals.

17. The pipelined analog to digital converter of claim 16, wherein said first clock signal and said second clock signal each have a period equal that of said master clock signal.

18. The pipelined analog to digital converter of claim 17, wherein in each stage;

said amplifier amplifies said first residual signal when said
first clock signal is at a first state; and
said amplifier amplifies said second residual signal when
said second clock signal is at a second stage.

19. An integrated circuit, comprising:
a substrate; and
a pipelined analog to digital converter in the substrate, the
converter comprising:
a plurality of stages, each stage further comprising;
an input terminal;
an output terminal;
an amplifier, coupled to said output terminal;
a first processing section for performing a partial analog to digital conversion of a first signal and for providing a first residual signal to said amplifier; and
a second processing section for performing a partial analog to digital conversion of a second signal and for providing a second residual signal to said amplifier;
a first digital block, for receiving results of a partial analog to digital conversion from the first processing section of each stage, and for providing a full analog to digital conversion of a first input signal; and
a second digital block, for receiving results of a partial analog to digital conversion from the second processing section of each stage, and for providing a full analog to digital conversion of a second input signal;
wherein said plurality of stages are arranged in a cascade so that the output terminal of one stage is coupled to the input terminal of a subsequent stage.

20. A processor based system, comprising:
a processor; and
an analog to digital converter, coupled to said processor, said analog to digital converter comprising:
a plurality of stages, each stage further comprising;
an input terminal;
an output terminal,
an amplifier, coupled to said output terminal;
a first processing section for performing a partial analog to digital conversion of a first signal and for providing a first residual signal to said amplifier; and
a second processing section for performing a partial analog to digital conversion of a second signal and for providing a second residual signal to said amplifier;
a first digital block, for receiving results of a partial analog to digital conversion from the first processing section of each stage, and for providing a full analog to digital conversion of a first input signal; and
a second digital block, for receiving results of a partial analog to digital conversion from the second processing section of each stage, and for providing a full analog to digital conversion of a second input signal;
wherein said plurality of stages are arranged in a cascade so that the output terminal of one stage is coupled to the input terminal of a subsequent stage.

21. The system of claim 20, further comprising:
a clock generator that receives a master clock signal and produces a first clock signal and a second clock signal as alternating, non-overlapping signals;
wherein said first clock signal and said second clock signal each have a period equal that of said master clock signal.

22. The system of claim 21,
wherein in each stage;
said amplifier amplifies said first residual signal when said first clock signal is at a first state; and
said amplifier amplifies said second residual signal when said second clock signal is at a second state.

23. A method for operating a switched capacitor amplifier, comprising:
receiving a master clock signal;
generating a first clock signal from said master clock signal;
generating a second clock signal from said master dock signal;
when the first clock signal is in a first state;
receiving a first input in a first capacitor network;
while the first clock signal is in a second state;
coupling the first capacitor network to an amplifier; and
amplifying said first input to produce a first output using said amplifier and said first capacitor network;
when the second clock signal is in the first state;
receiving a second input in a second capacitor network;
while the second clock signal is in the second state;
coupling the second capacitor network to an amplifier; and
amplifying said second input to produce a second output using said amplifier and said second capacitor network;
wherein only one of said first and second dock signals is in the first state at any time.

24. The method of claim 23, further comprising:
when the first clock signal is in the second state;
decoupling said second capacitor network from said amplifier; and
when the second clock signal is in the second state;
decoupling said first capacitor network from said amplifier;
wherein when said second clock signal is in the first state said first clock signal is in the second state, and when said first clock signal is in the first state said second clock signal is in the second state.

25. A method for converting analog signals into digital signals, comprising:
receiving a master clock signal;
generating a first clock signal from said master clock signal;
generating a second clock signal from said master clock signal;
when the first clock signal is in a first state;
at each one of a plurality of stages;
receiving a first input signal at an input terminal;
when the first clock signal is in a second state;
at each one of a plurality of stages;
partially converting the first input signal into a first partial digital signal;
generating a first residual signal equal to the input signal minus a signal equal in magnitude to said first partial digital signal;
amplifying said first residual signal; and
outputting said amplified first residual signal as the first input signal to a next one of said plurality of stage; and
at a first digital block;
receiving said first partial digital signal; and
outputting a first full digital signal based on each one of said first partial digital signals;

when the second clock signal is in the first state;
  at each one of the plurality of stages;
    receiving a second input signal at an input terminal;
when the second clock signal is in the second state;
  at each one of the plurality of stages;
    partially converting the second input signal into a second partial digital signal;
    generating a second residual signal equal to the input signal minus a signal equal in magnitude to said second partial digital signal;
    amplifying said second residual signal; and
    outputting said amplified second residual signal as the second input signal to the next one of said plurality of stages; and
  at a second digital block;
    receiving said second partial digital signal; and
    outputting a second full digital signal based on each one of said second partial digital signals;
  wherein only one of said first and second clock signals is in the first state at any time.

26. The method of claim 25, wherein when said second clock signal is in a first state said first clock signal is in the second state, and when said first clock signal is in the first state said second clock signal is in the second state.

27. An imager comprising:
an imaging sensor;
at least one analog-to-digital converter, coupled to said imaging sensor, wherein said analog-to-digital converter further comprises;
  a circuit, comprising:
    a first and a second input connections;
    an amplifier having a first amplifier input, a second amplifier input, a first amplifier output, and a second amplifier output;
    a first network that is switchable to receive at least a first differential input signal from said first and second input connections and a first differential feedback signal from said first and second amplifier outputs, and that provides said at least a first differential signal to the first and second inputs of said amplifier; and
    a second switchable network that receives at least a second differential input signal from said first and second input connections and a second differential feedback signal from said first and second amplifier outputs, and that provides said at least second differential signal to the first and second input of said amplifier;
    wherein said first and second network are switched so that at any given time only one of said first and second switchable networks is coupled to said first and second input connections, said first and second amplifier inputs, and said first and second amplifier outputs.

28. An imager comprising:
an integrated circuit, the integrated circuit comprising:
a substrate;
an imaging sensor on the substrate;
at least one analog-to-digital converter on the substrate, coupled to said imaging sensor, wherein said analog-to-digital converter further comprises;
  a circuit, comprising:
    a first and a second input connections;
    an amplifier having a first amplifier input, a second amplifier input, a first amplifier output, and a second amplifier output;
    a first network that is switchable to receive at least a first differential input signal from said first and second input connections and a first differential feedback signal from said first and second amplifier outputs, and that provides said at least a first differential signal to the first and second inputs of said amplifier; and
    a second switchable network that receives at least a second differential input signal from said first and second input connections and a second differential feedback signal from said first and second amplifier outputs, and that provides said at least second differential signal to the first and second input of said amplifier;
  wherein
    said first and second network are switched so that at any given time only one of said first and second switchable networks is coupled to said first and second input connections, said first and second amplifier inputs, and said first and second amplifier outputs.

29. A switched capacitor amplifier, comprising:
an amplifier;
a first capacitor network, controllably coupled to said amplifier; and
a second capacitor network, controllably coupled to said amplifier;
wherein only one of said first and second capacitor networks is coupled to said amplifier at any given time.

30. A circuit comprising:
first and second input connections;
a first switchable network that receives input signals from the first input connection and provides output signals to a first input of an amplifier; and
a second switchable network that receives input signals from the second input connection and that provides output signal to a second input of the amplifier;
the first and second switchable networks each including first and second subnetworks, the switchable networks switching together between a first state in which each network's first subnetwork receives an input signal and each network's second subnetwork provides an output signal and a second state in which each network's second subnetwork receives an input signal and each network's first subnetwork provides an output signal.

31. A method of operating an amplifier comprising:
alternating between first and second phases, each phase receiving two respective input signals;
during each first phase, providing the two input signals received during the preceding second phase as a differential signal to the amplifier; and
during each second phase, providing the two input signals received during the preceding first phase as a differential signal to the amplifier.

32. A circuit comprising:
an amplifier with first and second differential inputs; and
a switching network that alternates between first and second phases;
  the switching network respectively receiving first and second input signals during each phase; the switching network, during each first phase, providing first and second input signals received during a preceding second phase as a differential signal to the amplifier;
  the switching network, during each second phase providing the first and second input signals received during a preceding first phase as a differential signal to the amplifier.

* * * * *

UNITED STATES PATENT AND TRADEMARK OFFICE
CERTIFICATE OF CORRECTION

PATENT NO.     : 6,870,495 B1
DATED          : March 22, 2005
INVENTOR(S)    : Ali E. Zadeh et al.

It is certified that error appears in the above-identified patent and that said Letters Patent is hereby corrected as shown below:

Column 1,
Line 44, "$\Phi$and" should read -- $\Phi$ and --;

Column 3,
Line 49, "operation an" should read -- operation of an --;

Column 4,
Line 37, "include" should read -- includes --;

Column 5,
Line 5, "$\Phi 41$" should read -- $\Phi 1$ --;
Line 15, "output" should read -- outputs --;
Line 17, "output" should read -- outputs --;

Column 6,
Line 60, "least second" should read -- least a second --;
Line 63, "network" should read -- networks --;

Column 7,
Line 56, "least second" should read -- least a second --;

Column 9,
Line 4, "stage" should read -- state --;

Column 11,
Line 48, "network" should read -- networks --;

UNITED STATES PATENT AND TRADEMARK OFFICE
CERTIFICATE OF CORRECTION

PATENT NO. : 6,870,495 B1
DATED : March 22, 2005
INVENTOR(S) : Ali E. Zadeh et al.

It is certified that error appears in the above-identified patent and that said Letters Patent is hereby corrected as shown below:

Column 12,
Line 35, "signal" should read -- signals --.

Signed and Sealed this

Second Day of August, 2005

JON W. DUDAS
*Director of the United States Patent and Trademark Office*